United States Patent
Park

(10) Patent No.: US 7,330,551 B2
(45) Date of Patent: Feb. 12, 2008

(54) APPARATUS AND METHOD FOR CONTROLLING INPUT SIGNAL LEVEL

(75) Inventor: Jin-youl Park, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 778 days.

(21) Appl. No.: 10/735,746

(22) Filed: Dec. 16, 2003

(65) Prior Publication Data

US 2004/0156229 A1 Aug. 12, 2004

(30) Foreign Application Priority Data

Feb. 7, 2003 (KR) .................. 10-2003-0007937

(51) Int. Cl.
*H04H 5/00* (2006.01)

(52) U.S. Cl. .................. 381/11; 381/104; 381/107; 381/124; 381/109; 381/56; 700/94

(58) Field of Classification Search ........ 381/104–105, 381/107, 109, 11, 124, 56; 700/94
See application file for complete search history.

(56) References Cited

U.S. PATENT DOCUMENTS

| | | | | |
|---|---|---|---|---|
| 4,425,628 A * | 1/1984 | Bedard et al. ............ 710/8 |
| 5,347,499 A * | 9/1994 | Woo ....................... 369/4 |
| 5,878,098 A * | 3/1999 | Wang et al. ............ 375/377 |
| 6,076,504 A * | 6/2000 | Stavnheim et al. ...... 123/447 |
| 6,144,658 A * | 11/2000 | Lebizay et al. .......... 370/352 |
| 6,377,862 B1 * | 4/2002 | Naruki et al. ............ 700/94 |
| 6,819,407 B2 * | 11/2004 | Arita et al. ............. 356/4.01 |
| 6,904,783 B2 * | 6/2005 | Elenich et al. ........... 73/1.73 |
| 2003/0137341 A1 * | 7/2003 | LeChevalier ............ 327/536 |

* cited by examiner

*Primary Examiner*—Disler Paul
(74) *Attorney, Agent, or Firm*—Sughrue Mion, Pllc.

(57) ABSTRACT

Disclosed are an apparatus and a method for controlling an input signal level. The apparatus for controlling an input signal level according to the present invention includes: a memory for storing a current input signal level, a previous input signal level, a maximum change value, a maximum no-change value, a change counter value and a no-change counter value; a determining unit for determining whether the values stored in the memory are identical; and a control unit for reading out the values stored in the memory to output them to the determining unit and storing a predetermined level as the current input signal level based on the determination by the determining unit. The present invention can maintain an input signal at a predetermined level and thereby ensure stability of a device to which the level is applied and stability of a signal outputted from the device.

16 Claims, 6 Drawing Sheets

APPARATUS AND METHOD FOR CONTROLLING INPUT SIGNAL LEVEL

CROSS-REFERENCE TO RELATED APPLICATIONS

This application claims the benefit of Korean Patent Application No. 2003-07937 filed Feb. 7, 2003, in the Korean Intellectual Property Office, the disclosure of which is incorporated herein by reference.

BACKGROUND

1. Field of the Invention

The present invention relates to an apparatus and a method for controlling an input signal level, and more particularly, to an apparatus and a method for controlling an input signal level by recognizing the level of a signal inputted to a device and comparing it with the level of a previous input signal.

2. Description of the Related Art

Generally, a signal inputted to a device is outputted in a predetermined pattern from the device. Also, in most cases, users do not expect or wish to have a signal outputted from a device in the same pattern as inputted to the device. If a voltage supplied to a battery is recognized in its original pattern due to its instability, a device receiving the voltage will likely enter a sleep mode or mistakenly recognize the voltage supply as a wake-up event in the sleep mode. Also, users may be interrupted to listen to stereo audio sources through an audio system, when the input mode is suddenly changed to mono mode from stereo mode due to an error in the audio system caused by the voltage instability.

Conventionally, signal levels recognized at the signal input point are applied to a device without any change. The conventional example is described in detail with reference to FIG. 1. FIG. 1 is a timing diagram showing levels at which an input signal is recognized according to a first conventional case.

As shown, the levels of an input signal are recognized and applied to a device without any change. Thus, the $1^{st}$, $3^{rd}$, $5^{th}$, $7^{th}$ and $10^{th}$ intervals are recognized as a first level, while the $2^{nd}$, $4^{th}$, $6^{th}$, $8^{th}$, $9^{th}$ and $11^{th}$ intervals are recognized as a second level.

However, it may not be desired to apply the same levels to a device. In other words, it would be more preferable for a device receiving the input signal to recognize the $2^{nd}$, $4^{th}$ and $6^{th}$ intervals as the first level and the $10^{th}$ interval as the second level. According to the first conventional example, the device will likely mistakenly recognize the temporary change of level in the $2^{nd}$ interval as a change which has lasted for a predetermined period of time.

To solve this problem, another suggestion was made, and it is described in detail with reference to FIG. 2 showing the second conventional example.

FIG. 2 is a timing diagram showing levels at which an input signal is recognized according to the second conventional example.

According to the second conventional example, if there is no difference between a current input signal level to be controlled and a previous input signal level, the current input signal level will be applied to a device exactly as recognized. If the current input signal level to be controlled is different from the previous input signal level, it will be adjusted by a method as explained below.

If no change is detected between the current input signal level and the previous input signal level, the previous input signal level is applied instead of the current one. If there is a change between the two signal levels, the recognized level of the current input signal is applied.

Therefore, the $1^{st}$, $2^{nd}$, $3^{rd}$, $5^{th}$, $7^{th}$ and $10^{th}$ intervals are recognized as the first level, while the $4^{th}$, $6^{th}$, $8^{th}$, $9^{th}$ and $11^{th}$ intervals are recognized as the second level.

However, applying the same level according to the second conventional example, to a device is not always efficient. In other words, it would be more proper for a device receiving the input signal to recognize the $4^{th}$ and $6^{th}$ intervals as the first level and the $10^{th}$ interval as the second level.

SUMMARY

Accordingly, the present invention has been made to solve the above-mentioned problems occurring in the prior art, and one aspect of the present invention is to provide an apparatus and a method for controlling an input signal level by maintaining an input signal at a predetermined level to secure stability of a device receiving the input signal.

Another aspect of the present invention is to provide an apparatus and a method for controlling an input signal level by maintaining an input signal at a predetermined level to secure stability of a signal outputted from a device.

In order to accomplish the above aspects and/or other features of the present invention, there is provided an apparatus for controlling an input signal level recognized when the signal is inputted to a device, said apparatus comprising: a memory for storing a current input signal level to be controlled, a previous input signal level which is the level of an input signal preceding the current input signal, a maximum change value which is the upper limit of an allowable range of level variation in the device, a maximum no-change value which is the upper limit of an allowable range of level invariation in the device, a change counter value which is the number of input signals having different levels detected by comparing the current input signal level with the previous input signal level, and a no-change counter value which is the number of input signals having the same level detected by comparing the current input signal level with the previous input signal level; a determining unit for determining whether the values stored in said memory are identical based either on the maximum change value and the change counter value, or on the maximum no-change value and the no-change counter value, among the values stored in said memory; and a control unit for reading out the values stored in said memory to output them to said determining unit and storing a predetermined level as the current input signal level based on the determination by said determining unit as to whether said values are identical.

The determining unit further determines whether the current input signal level is identical to the previous input signal level. The control unit increases the change counter value or the no-change counter value by one based on the determination as to whether the two levels are identical, and stores the increased value.

If the current input signal level is identical to the previous input signal level, the control unit will increase the no-change counter value by one. If not, the control unit will increase the change counter value by one.

If the change counter value and the maximum change value are identical, the control unit will reset the change counter value and the no-change counter value. Also, the control unit will store the level recognized at the signal input point as the current input signal level.

If the change counter value and the maximum change value are not identical, the control unit will control the determining unit to determine whether the no-change counter value and the maximum no-change counter value are identical.

If the no-change counter value and the maximum no-change value are identical, the control unit will reset the change counter value and the no-change counter value, and will store the level recognized at the signal input point as the current input signal level.

If the no-change counter value and the maximum no-change value are not identical, the control unit will store the previous input signal level as the current input signal level.

The input signal levels are either high level or low level of a digital voltage measuring signal outputted to an external device from a battery.

The input signal levels are either mono mode or stereo mode outputted from an audio system.

To accomplish the aspects of the present invention, there is also provided a method for controlling an input signal level recognized when the signal is inputted to a device, said method comprising the steps of: a) determining whether a current input signal level to be controlled is identical to a previous input signal level which is the level of an input signal preceding the current input signal; b) increasing any one of a change counter value which is the number of input signals having different levels detected by comparing the current input signal level with the previous input signal level, or a no-change counter value which is the number of input signals having the same level detected by comparing the current input signal level with the previous input signal level, by one based on the determination at step a); c) determining the level of the current input signal, depending either on whether a maximum change value which is the upper limit of an allowable range of level variation in the device and the change counter value are identical, or on whether a maximum no-change value which is the upper limit of an allowable range of level invariation in the device and the no-change counter value are identical; and d) setting a predetermined level as the current input signal level based on the determined level of the current input signal.

BRIEF DESCRIPTION OF THE DRAWINGS

The above objects and other advantages of the present invention will be more apparent from the following detailed description taken in conjunction with the accompanying drawings, in which.

DETAILED DESCRIPTION OF THE EXEMPLARY EMBODIMENTS

Hereinafter, exemplary embodiments of the present invention will be described in detail with reference to the accompanying drawings.

Figure 1:
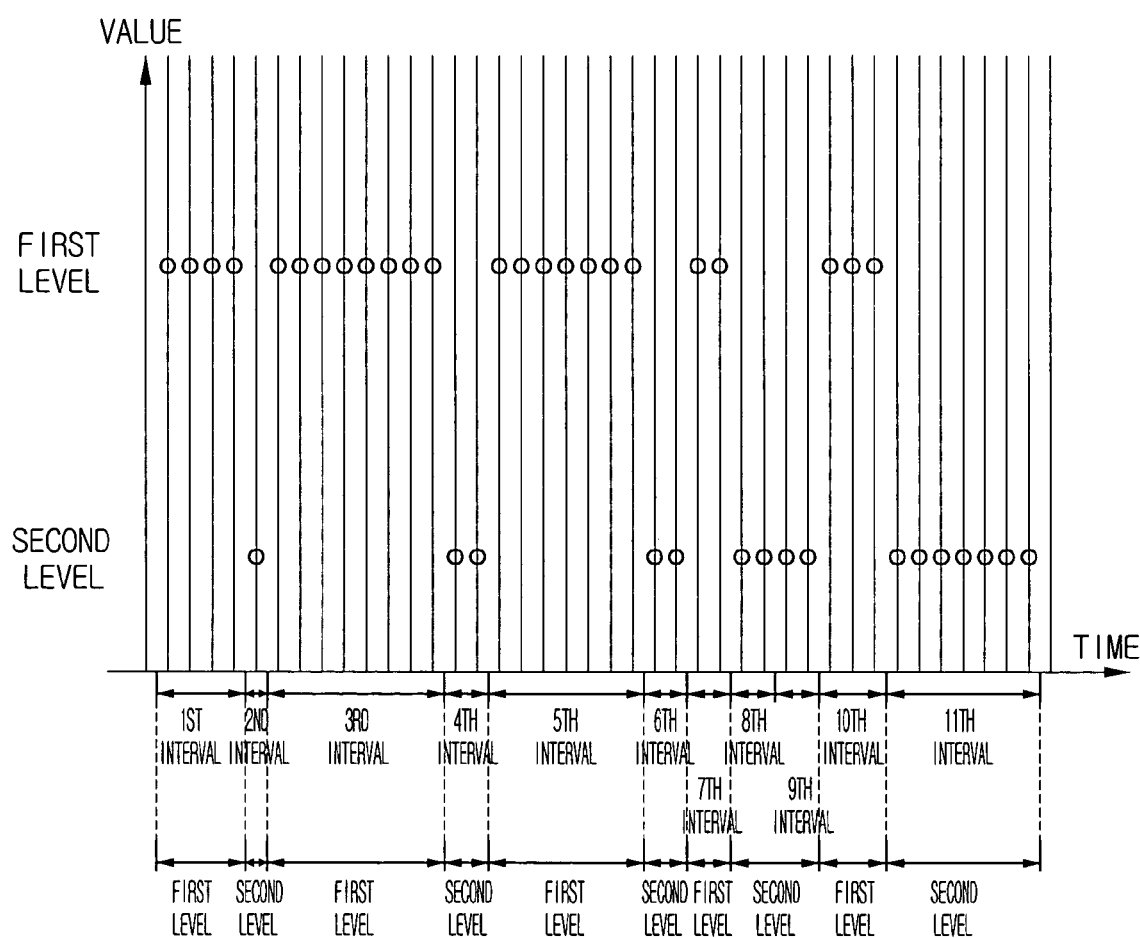
FIG. 1 is a timing diagram showing levels at which an input signal is recognized according to the first conventional example.
Figure 2:
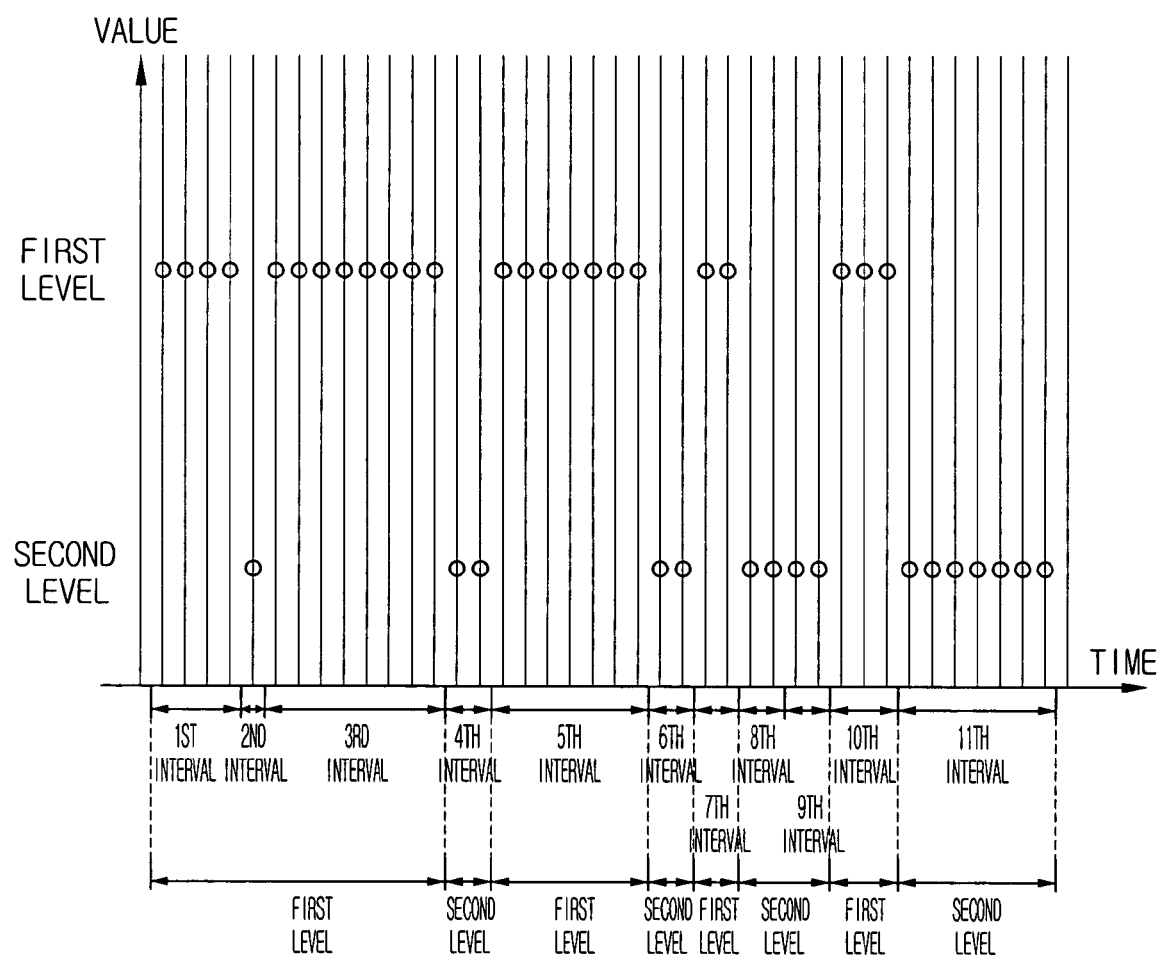
FIG. 2 is a timing diagram showing levels at which an input signal is recognized according to the second conventional example.
Figure 3:
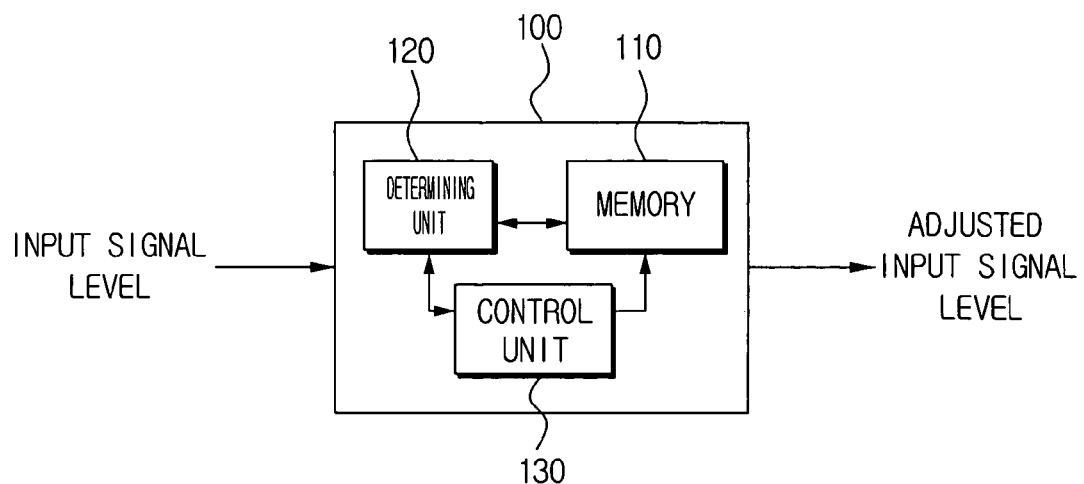
FIG. 3 is a block diagram of an apparatus for controlling an input signal level according to an exemplary embodiment of the present invention.

FIG. 3 is a block diagram of an apparatus for controlling an input signal level according to an exemplary embodiment of the present invention.

The apparatus 100 for controlling an input signal level according to the present invention includes a memory 110, a determining unit 120 and a control unit 130.

The memory 110 stores a maximum change value, a maximum no-change value, a change counter value and a no-change counter value. These values are read out under the control of the control unit 130 and outputted to the determining unit 120.

The maximum change value and the maximum no-change value refer to the upper limits of allowable level variation range and level invariation range in a device to which a current input signal level to be controlled is applied, based on the comparison with a previous input signal level. The current input signal level to be controlled is a signal level recognized when a signal is inputted to the device. The previous input signal level is the level of a signal preceding the current signal level to be controlled.

The maximum change value and the maximum no-change value are set by a user and stored. When setting these two values, the user should consider the responsiveness and endurance of the device to which an input signal level controlled by the apparatus 100 is applied.

The apparatus 100 for controlling input signal levels compares the current input signal level to be controlled with the previous input signal level. When the two levels are different, the change counter value refers to the number of input signals having different levels. When the two levels are identical, the no-change counter value refers to the number of input signals having the same level.

The change counter value and the no-change counter value are initially set to zero, "0". When these values meet predetermined requirements, they are reset to zero, "0," again. The change counter value and the no-change counter value are stored in the memory 110. When predetermined requirements are met, these values are increased by one and stored again in the memory 110.

The memory 110 also stores a current input signal level recognized and to be controlled, together with a previous input signal level. Under the control of the control unit 130, the determining unit 120 determines whether the current input signal level is identical to the previous input signal level.

The determining unit 120, under the control of the control unit 130, receives the values stored in the memory 110 and determines whether the received values are identical.

The control unit 130 reads out the values stored in the memory 110 and outputs them to the determining unit 120. Based on the determination by the determining unit 120, the control unit 130 reads out any one of the change counter value and no-change counter value stored in the memory 110. The control unit 130 increases the read-out value by one and stores the increased value in the memory 110.

Also, based on the determination by the determining unit 120, the control unit 130 controls such that a predetermined level can be stored as the current input signal level in the memory 110. The predetermined level is either the recognized current input signal level or the previous input signal level.

The apparatus 100 self-adjusts the level of an input signal and outputs the adjusted signal level to control the device or outputs a control signal for adjusting the device to another apparatus controlling the device.

Figure 4:
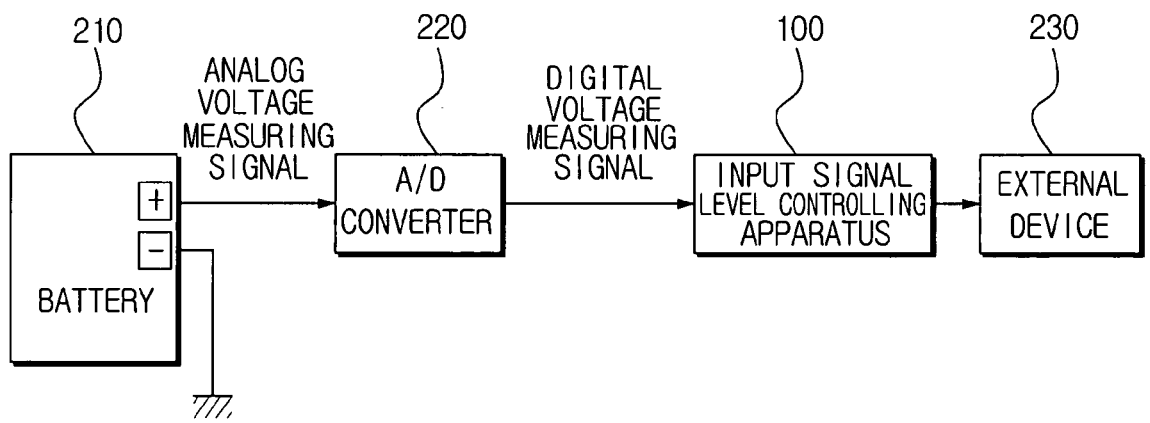
FIG. 4 is a block diagram showing an apparatus for controlling an input signal level being connected to a battery for power supply and an external device to which power is supplied, according to an exemplary embodiment of the present invention.

FIG. 4 is a block diagram showing the first embodiment of the present invention wherein an apparatus for controlling input signal levels is connected to a battery for power supply and an external device to which power is supplied.

A battery 210 supplies power to an external device 230. The battery 210 outputs an analog voltage measuring signal. The external device 230 is converted to a sleep mode based on the level of an input signal or to an operation mode by receiving a wake-up event in the sleep mode.

An A/D converter 220 receives an outputted analog voltage measuring signal and converts the signal into a digital voltage measuring signal. Input signal levels applied to the first embodiment of the present invention are either a high level or a low level of the converted digital voltage measuring signal.

The apparatus 100 for controlling input signal levels receives the converted digital voltage measuring signal. As explained above, the converted digital voltage measuring signal is controlled by the apparatus 100 and outputted to the external device 230. The digital voltage measuring signal level outputted to the external device 230 is either an input signal level to be controlled or a previous input signal level.

Thus, the external device 230 can correctly determine the point of being converted to sleep mode or the point of recognizing a wake-up event.

Figure 5:
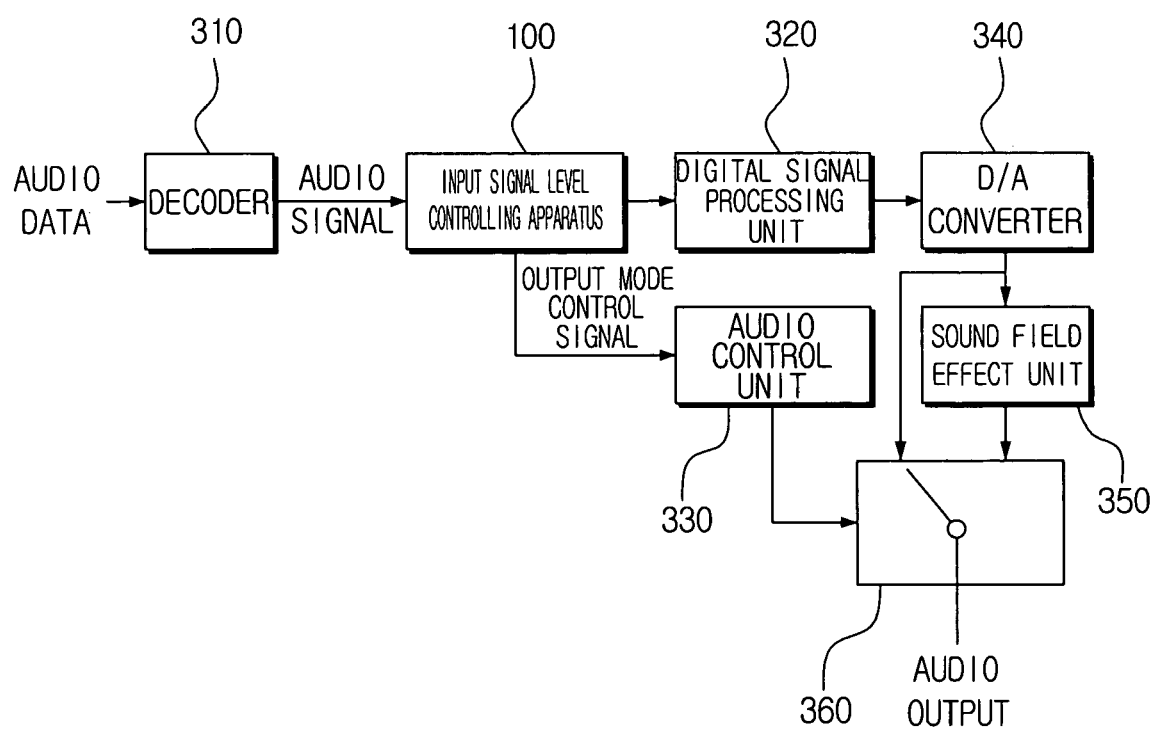
FIG. 5 is a block diagram showing an apparatus for controlling an input signal level being applied to an audio system according to a second embodiment of the present invention.

FIG. 5 is a block diagram showing the second embodiment of the present invention wherein an apparatus for controlling input signal levels is applied to an audio system.

Generally, the output mode of an audio system can be either a mono mode or a stereo mode. The mono mode outputs the same audio signal from the right and left channels. The stereo mode outputs different audio signals from the right and left channels.

The audio system includes a decoder 310, a digital signal processing unit 320, an audio control unit 330, a D/A converter 340, a sound field effect unit 350 and a switch unit 360. The audio system comprising the apparatus 100 for controlling input signal levels will be described below in more detail.

The audio control unit 330 controls the overall operation of the audio system. Also, the audio control unit 330 controls the switch unit 360 according to an output mode control signal outputted from the input signal level controlling apparatus 100. In addition, the audio control unit 330 determines whether an audio signal will be outputted directly or through the sound field effect unit 350.

The decoder 310 decodes an inputted audio signal according to the encoded manner and outputs the decoded audio signal to the input signal level controlling apparatus 100.

The apparatus 100 receives the audio signal outputted from the decoder 310. The received audio signal is then outputted to the digital signal processing unit 320. The apparatus 100 also determines whether the output to the speaker (not shown) should be in stereo mode or mono mode based on the received audio signal. The apparatus 100 outputs an output mode control signal corresponding to the determined output mode to the audio control unit 330.

The digital signal processing unit 320 corrects any error in the audio signal outputted from the apparatus 100 and converts the audio signal into a digital audio signal to output it.

The D/A converter 340 converts the digital audio signal outputted from the digital signal processing unit 320 into an analog audio signal.

The sound field effect unit 350 outputs the analog audio signal converted by the D/A converter 340 in stereo output mode.

The switch unit 360 operates under the control of the audio control unit 330 and switches paths to output an analog audio signal from the D/A converter 340 in a predetermined output mode. The predetermined output mode is either a stereo mode or a mono mode.

The operation of a general audio system having the above configuration, which changes the output mode and outputs audio signals, will be described in further detail. The audio control unit 330 detects an output mode control signal outputted from the input signal level controlling apparatus 100. If the output mode control signal is determined to be a command for output in stereo mode, the audio control unit 330 will transmit the control signal to the switch unit 360 so that the output path will be set toward the sound field effect unit 350. Then, the audio signal outputted from the D/A converter 340 will be outputted in stereo mode through the sound field effect unit 350 along the path set by the switch unit 360. The sound field effect unit 350 produces the greatest sound field effect when outputting an audio signal in stereo mode.

If the output mode control signal from the apparatus 100 is a command for output in mono mode, the audio control unit 330 will control the switch unit 360 to output the audio signal in mono mode so that the audio signal will be outputted directly to the speaker (not shown) without passing through the sound field effect unit 350.

Even if the audio signal, which is being outputted in stereo mode from an audio system, is changed to mono mode, it is forced to be corrected to the stereo mode by the apparatus 100. Accordingly, the audio signal can be continuously outputted in stereo mode.

Figure 6:
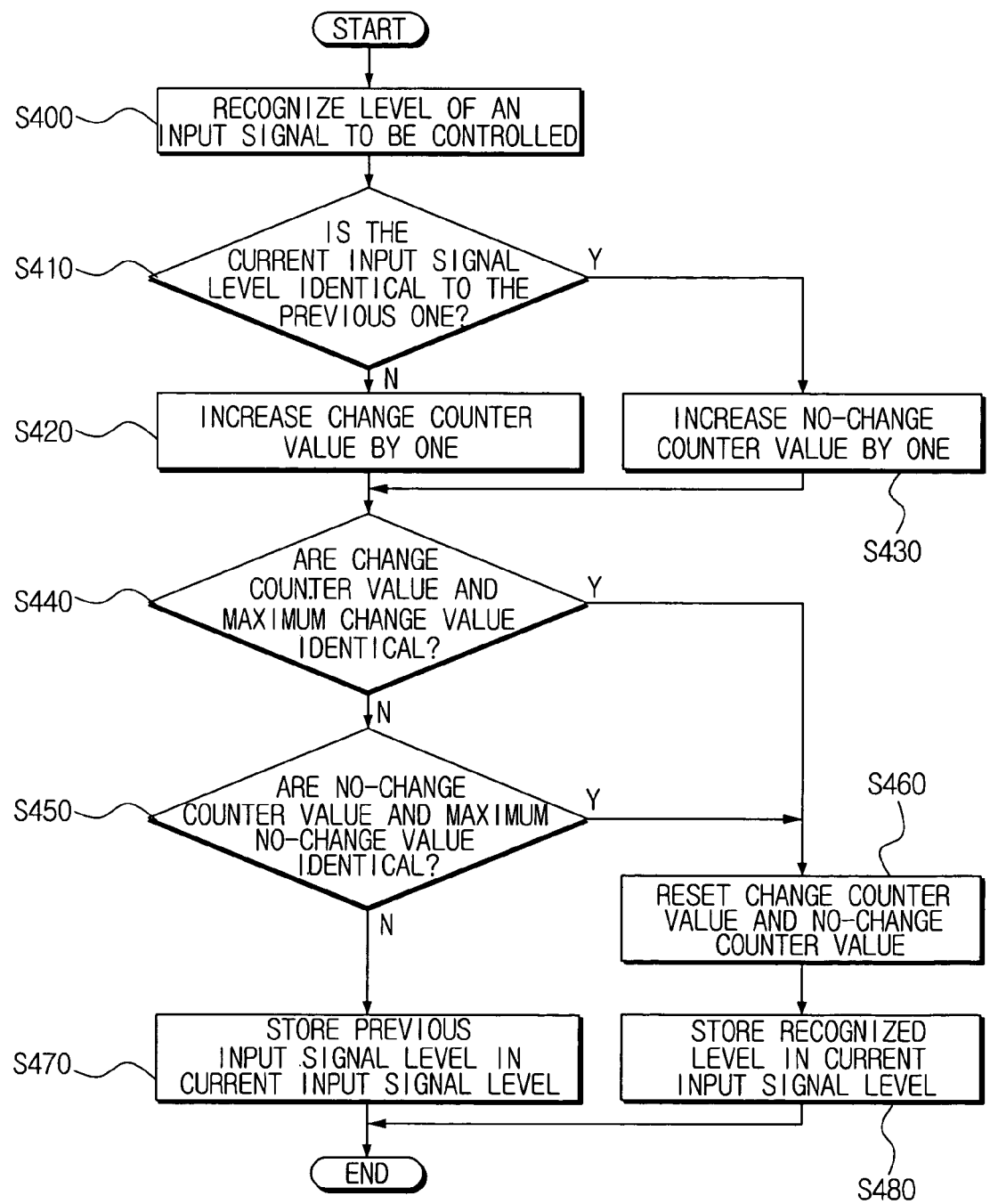
FIG. 6 is a flow chart showing a process of controlling an input signal level according to an exemplary embodiment of the present invention.

FIG. 6 is a flow chart showing a process of controlling an input signal level according to the present invention.

Referring to FIGS. 3 to 6, the apparatus 100 recognizes an input signal level to be controlled, which is the level of a signal currently inputted, and stores the recognized level in the memory 110 (S400).

The input signal level to be controlled and previous input signal level stored in the memory 110 are outputted to the determining unit 120 under the control of the control unit 130. The determining unit 120 then determines whether the two levels are identical (S410).

If the two levels are determined to be identical at step 410, the apparatus 100 will read out the no-change counter value stored in the memory 110 under the control of the control unit 130 and increase the value by one (S420). If the two levels are determined not to be identical at step 410, the apparatus 100 will read out the change counter value stored in the memory 110 and increases the value by one (S430).

Also, under the control of the control unit 130, the change counter value stored in the memory 110 and the maximum change value initially set and stored in the memory 110 are outputted to the determining unit 120 to determine whether the two values are identical (S440).

If the two values are determined to be identical at step 440, the change counter value and no-change counter value stored in the memory 110 will be reset (S460). Also, the level recognized at the point of signal input will be stored in the input signal level to be controlled (S480).

If the two values are determined to be different at step 440, the no-change counter value stored in the memory 110 and the maximum no-change value set and stored at the point of signal input will be outputted to the determining unit 120 under the control of the control unit 130 to determine whether the two values are identical (S450).

If the two values are determined to be identical at step 450, the change counter value and no-change counter value stored in the memory 110 will be reset (S460). Also, the level recognized at the signal input point will be stored in the input signal level to be controlled (S480). If the two values are determined to be different at step 450, the previous input signal level will be stored in the input signal level to be controlled (S470).

Figure 7:
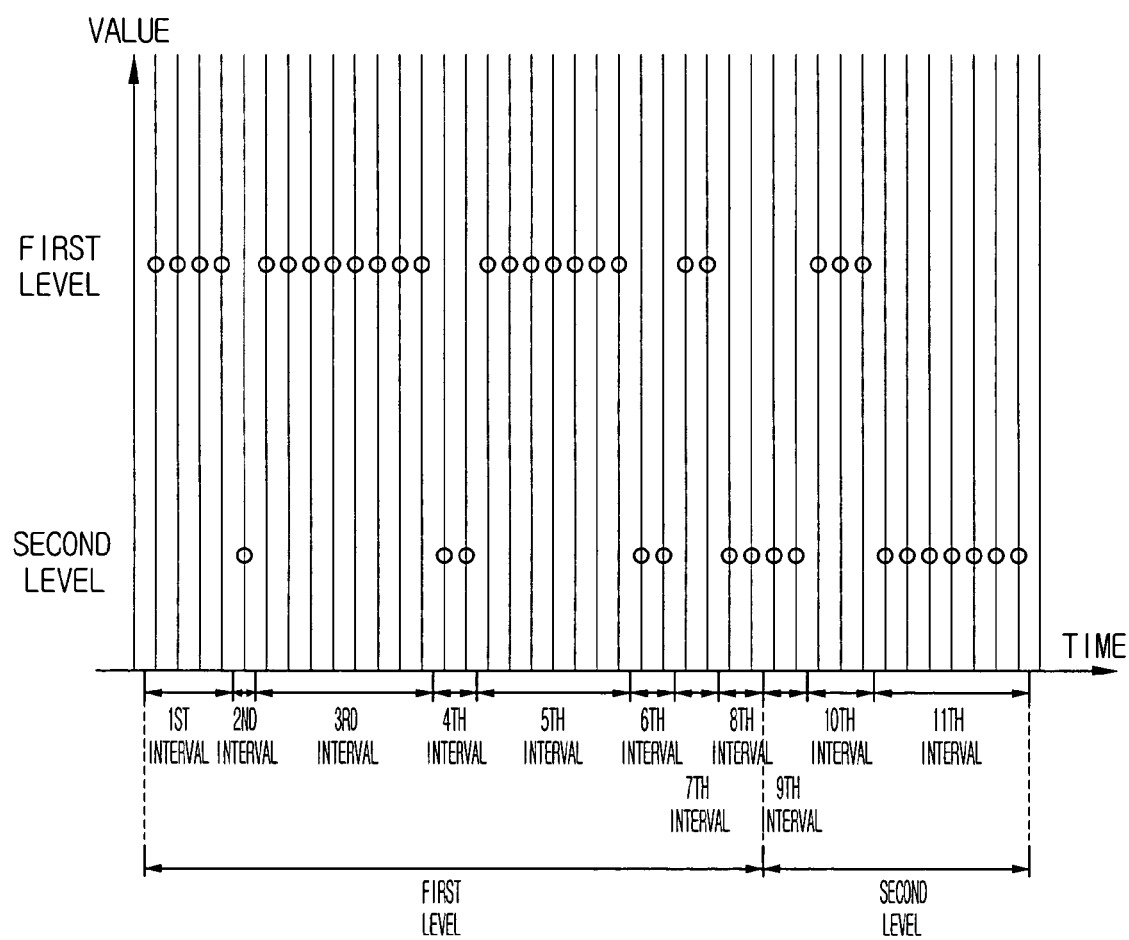
FIG. 7 is a timing diagram showing levels at which an input signal is recognized according to an exemplary embodiment of the present invention.

FIG. 7 is a timing diagram showing levels at which an input signal is recognized according to the present invention.

As shown in FIG. 7, the level of an input signal is recognized by a device based on the apparatus in FIG. 3 and the process in FIG. 6.

In the embodiment as shown in FIG. 7, if the maximum no-change value and the maximum change value are set to 5 and 4, respectively, the $1^{st}$ to $8^{th}$ intervals will be recognized as the first level, while the $9^{th}$ to $11^{th}$ intervals will be recognized as the second level. Therefore, the $2^{nd}$, $4^{th}$, $6^{th}$ and $10^{th}$ intervals will be recognized as a level desired to be recognized by the device.

The apparatus and method for controlling input signal levels according to the present invention maintain an input signal at a predetermined level and thereby ensure stability of a device to which the level is applied and stability of a signal outputted from the device.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for controlling an input signal level recognized when an input signal is inputted to a device, said apparatus comprising:
    a memory storing values including a current input signal level to be controlled, a previous input signal level which is a level of an input signal preceding a current input signal, a maximum change value which is an upper limit of an allowable range of level variation in the device, a maximum no-change value which is an upper limit of an allowable range of level invariation in the device, a change counter value which is a number of input signals having different levels detected by comparing the current input signal level with the previous input signal level, and a no-change counter value which is a number of input signals having a same level detected by comparing the current input signal level with the previous input signal level;
    a determining unit determining whether corresponding values stored in said memory are substantially identical, based either on the maximum change value and the change counter value, or on the maximum no-change value and the no-change counter value, and outputting a determination; and
    a control unit reading the values stored in said memory to output the values to said determining unit and storing a predetermined level as the current input signal level based on the determination by said determining unit as to whether said corresponding values are substantially identical.

2. The apparatus according to claim 1, wherein said determining unit further determines whether the current input signal level is substantially identical to the previous input signal level and outputs a first determination, and wherein said control unit controls such that the change counter value or the no-change counter value is increased by one based on the first determination as to whether the two levels are substantially identical, and an increased value is stored.

3. The apparatus according to claim 2, wherein said control unit increases the no-change counter value by one when the current input signal level is substantially identical to the previous input signal level, and increases the change counter value by one when the current input signal level is substantially not identical to the previous input signal level.

4. The apparatus according to claim 3, wherein said control unit controls such that the change counter value and the no-change counter value are reset, and a level recognized at a signal input point is stored as the current input signal level, if the change counter value and the maximum change value are identical.

5. The apparatus according to claim 3, wherein said control unit controls said determining unit to determine whether the no-change counter value and the maximum no-change counter value are identical, if the change counter value and the maximum change value are not identical.

6. The apparatus according to claim 3, wherein said control unit controls such that the change counter value and the no-change counter value are reset, and a level recognized at the signal input point in the current input signal level is stored, if the no-change counter value and the maximum no-change value are identical.

7. The apparatus according to claim 3, wherein said control unit controls such that the previous input signal level is stored as the current input signal level, if the no-change counter value and the maximum no-change value are not identical.

8. The apparatus according to claim 1, wherein said input signal levels are either a high level or a low level of a digital voltage measuring signal outputted to an external device from a battery.

9. The apparatus according to claim 1, wherein said input signal levels are either in a mono mode or a stereo mode outputted from an audio system.

10. A method for controlling an input signal level of an input signal recognized when the signal is inputted to a device, said method comprising the steps of:
    a) determining whether a current input signal level to be controlled is substantially identical to a previous input signal level which is a level of an input signal preceding the current input signal;
    b) increasing any one of a change counter value which is a first number of input signals having different levels detected by comparing the current input signal level with the previous input signal level, or a no-change counter value which is a second number of input signals having a same level detected by comparing the current input signal level with the previous input signal level, by one based on the step a);
    c) determining the level of the current input signal, depending either on whether a maximum change value which is an upper limit of an allowable range of level variation in the device and the change counter value are identical, or on whether a maximum no-change value which is an upper limit of an allowable range of level invariation in the device and the no-change counter value are identical; and d) setting a predetermined level as the current input signal level based on the determined level of the current input signal.

11. The method according to claim 10, wherein said step b) increases the no-change counter value by one when the current input signal level is substantially identical to the previous input signal level, and increases the change counter value by one when the current input signal level is substantially not identical to the previous input signal level.

12. The method according to claim 10, wherein said step c) includes a step of determining whether the change counter value and the maximum change value are identical, and wherein said step d) resets the change counter value and the no-change counter value and stores the level recognized at a signal input point as the current input signal level, if the change counter value and the maximum change value are identical.

13. The method according to claim 12, wherein said step c) includes a step of determining whether the no-change counter value and the maximum no-change counter value are identical, if the change counter value and the maximum change value are not identical, and wherein said step d) resets the change counter value and the no-change counter value and stores the level recognized at the signal input point as the current input signal level, if the no-change counter value and the maximum no-change value are identical.

14. The method according to claim 13, wherein said step d) stores the previous input signal level as the current input signal level, if the no-change counter value and the maximum no-change value are not identical.

15. The method according to claim 10, wherein said input signal levels are either a high level or a low level of a digital voltage measuring signal outputted to an external device from a battery.

16. The method according to claim 10, wherein said input signal levels are either in a mono mode or a stereo mode outputted from an audio system.

* * * * *